(12) United States Patent
Ruffell et al.

(10) Patent No.: US 11,488,823 B2
(45) Date of Patent: *Nov. 1, 2022

(54) TECHNIQUES TO ENGINEER NANOSCALE PATTERNED FEATURES USING IONS

(71) Applicant: Varian Semiconductor Equipment Associates, Inc., Gloucester, MA (US)

(72) Inventors: Simon Ruffell, South Hamilton, MA (US); John Hautala, Beverly, MA (US); Adam Brand, Palo Alto, CA (US); Huixiong Dai, San Jose, CA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/170,351

(22) Filed: Feb. 8, 2021

(65) Prior Publication Data
US 2021/0166936 A1 Jun. 3, 2021

Related U.S. Application Data

(60) Division of application No. 15/978,722, filed on May 14, 2018, now Pat. No. 11,043,380, which is a
(Continued)

(51) Int. Cl.
*H01L 21/02* (2006.01)
*H01L 21/027* (2006.01)
(Continued)

(52) U.S. Cl.
CPC ...... *H01L 21/0273* (2013.01); *H01L 21/0337* (2013.01); *H01L 21/3086* (2013.01); *H01L 21/76816* (2013.01)

(58) Field of Classification Search
CPC ............. H01L 21/0273; H01L 21/0337; H01L 21/3086; H01L 21/76816
(Continued)

(56) References Cited

U.S. PATENT DOCUMENTS 4,484,979 A 11/1984 Stocker
4,680,085 A 7/1987 Vijan et al.
(Continued)

FOREIGN PATENT DOCUMENTS

CN 101211754 A 7/2008
JP H01231327 A 9/1989
(Continued)

OTHER PUBLICATIONS

Xin Sun et al., "Selective Enhancement of SiO2 Etch Rate by Ar-Ion Implantation for Improved Etch Depth Control," Electrochemical and Solid-State Lettes, 2007, D89-D91, 10(9), The Electrochemical Society.
(Continued)

*Primary Examiner* — Duy Vu N Deo
(74) *Attorney, Agent, or Firm* — KDB Firm PLLC

(57) ABSTRACT

A method of patterning a substrate. The method may include providing a surface feature on the substrate, the surface feature having a first dimension along a first direction within a substrate plane, and a second dimension along a second direction within the substrate plane, wherein the second direction is perpendicular to the first direction; and directing first ions in a first exposure to the surface feature along the first direction at a non-zero angle of incidence with respect to a perpendicular to the substrate plane, in a presence of a reactive ambient containing a reactive species; wherein the first exposure etches the surface feature along the first direction, wherein after the directing, the surface feature retains the second dimension along the second direction, and wherein the surface feature has a third dimension along the first direction different than the first dimension.

19 Claims, 9 Drawing Sheets

Related U.S. Application Data continuation of application No. 14/749,822, filed on Jun. 25, 2015, now Pat. No. 10,008,384.

(51) Int. Cl.
  *H01L 21/308* (2006.01)
  *H01L 21/033* (2006.01)
  *H01L 21/768* (2006.01)

(58) Field of Classification Search
  USPC .................................................. 438/712–724
  See application file for complete search history.

(56) References Cited

U.S. PATENT DOCUMENTS

| | | | |
|---|---|---|---|
| 4,859,908 A | | 8/1989 | Yoshida et al. |
| 5,350,499 A | | 9/1994 | Toshinori et al. |
| 6,238,582 B1 | * | 5/2001 | Williams ................. C23F 4/00 216/22 |
| 6,414,366 B1 | | 7/2002 | Kamijima |
| 6,787,052 B1 | | 9/2004 | Vaganov |
| 7,713,822 B2 | | 5/2010 | Thorup et al. |
| 7,767,977 B1 | | 8/2010 | Godet et al. |
| 7,790,621 B2 | | 9/2010 | Wen |
| 7,842,618 B2 | | 11/2010 | Kim et al. |
| 8,101,510 B2 | | 1/2012 | Godet et al. |
| 8,288,741 B1 | | 10/2012 | Miller et al. |
| 8,339,752 B1 | | 12/2012 | Hattori et al. |
| 8,421,139 B2 | | 4/2013 | Kanakasabapathy et al. |
| 9,139,914 B2 | | 9/2015 | Kim et al. |
| 9,984,889 B2 | | 5/2018 | Ruffell et al. |
| 10,008,384 B2 | * | 6/2018 | Ruffell ................ H01L 21/0337 |
| 11,043,380 B2 | * | 6/2021 | Ruffell ................ H01L 21/0273 |
| 2001/0025826 A1 | | 10/2001 | Pierson et al. |
| 2004/0197975 A1 | | 10/2004 | Krivokapic et al. |
| 2005/0130072 A1 | | 6/2005 | Koeda |
| 2006/0166419 A1 | | 7/2006 | Shimoyama et al. |
| 2007/0051622 A1 | | 3/2007 | Tang et al. |
| 2007/0281493 A1 | | 12/2007 | Fucsko et al. |
| 2008/0002749 A1 | | 1/2008 | Scherer et al. |
| 2008/0019408 A1 | | 1/2008 | Behfar |
| 2008/0233691 A1 | | 9/2008 | Cheng et al. |
| 2009/0023098 A1 | | 1/2009 | Jain et al. |
| 2009/0084757 A1 | | 4/2009 | Erokhin et al. |
| 2009/0250430 A1 | | 10/2009 | Zhang |
| 2010/0173498 A1 | | 7/2010 | Abatchev et al. |
| 2011/0021027 A1 | | 1/2011 | Johnson |
| 2011/0114851 A1 | | 5/2011 | Purser et al. |
| 2011/0248326 A1 | | 10/2011 | Kanakasabapathy et al. |
| 2013/0328157 A1 | | 12/2013 | Cheng et al. |
| 2014/0017817 A1 | | 1/2014 | Godet et al. |
| 2014/0080276 A1 | | 3/2014 | Brand et al. |
| 2014/0091394 A1 | | 4/2014 | Li et al. |
| 2014/0357080 A1 | | 12/2014 | Lisi et al. |
| 2015/0083581 A1 | | 3/2015 | Sherman et al. |
| 2015/0118604 A1 | | 4/2015 | Dynes et al. |
| 2015/0311073 A1 | | 10/2015 | Srinivasan et al. |

FOREIGN PATENT DOCUMENTS

| | | |
|---|---|---|
| JP | H03235331 A | 10/1991 |
| JP | 09-120954 A | 6/1997 |
| JP | 04-128394 A | 4/2004 |
| JP | 2004-152960 A | 5/2004 |
| JP | 2004253437 A | 9/2004 |
| JP | 2006-054317 A | 2/2006 |
| JP | 07-037869 A | 2/2007 |
| KR | 10-2006-0078440 B1 | 4/2007 |
| KR | 10-2015-0015130 A | 2/2015 |
| TW | 506006 B | 10/2002 |
| WO | 2000058953 A2 | 10/2000 |
| WO | 2014110379 A1 | 7/2014 |

OTHER PUBLICATIONS

Charavel, et al., "Etch Rate Modification of SiO2 by Ion Damage," Electrochemical and Solid State Letters, 2006, G245-G247, 9(7), The Electrochemical Society.

North, et al, "Tapered Windows in Phosphorus-Doped SiO2 by Ion Implantation," IEEE Transactions on Electron Devices, 1978, 809-812, ED-25, IEEE.

Ofan et al.,"Original of Highly Spatially Selective Etching in Deeply Implanted Complex Oxides," Applied Physic Letters, 2008, 181906-1-181906-3, 93, On-line publishing.

Jin-Kwan Lee et al., Oblique-Directional Plasma Etching of Si Using a Faraday Cage, Journal of the Electrochemical Society, 2009, D222-D225, 156 (7), The Electrochemical Society.

Steve R. Sherman, et al., Replacement Metal Gate Transistor, U.S. Appl. No. 13/921,731, filed Jun. 19, 2013.

Steve R. Sherman, et al., Process Flow for Replacement Metal Gate Transistors, U.S. Appl. No. 13/921,717, filed Jun. 19, 2013.

Richter et al., Creation of Vias With Optimized Profile for 3-D Through Silicon Interconnects (TSV), Plasma Processed and Polymers, Plasma Process. Polym. 2009, 6, S193-S197, DOI: 10.1002/ppap.200930501, pp. S193-S197.

Utke et al., Gas-assisted focused electron beam and ion beam processing and fabrication, J. Vac. Sci. Technol. B 26(4), Jul./Aug. 2008, 1071-1023/2008/26(4)/1197/80/, © 2008 American Vacuum Society, DOI: 10.1116/1.2955728, pp. 1197-1276.

International Search Report dated Aug. 30, 2016, for the International Patent Application No. PCT/US2016/035417 filed on Jun. 2, 2016, 3 pages.

Written Opinion dated Aug. 30, 2016, for the International Patent Application No. PCT/US2016/035417 filed on Jun. 2, 2016, 8 pages.

* cited by examiner

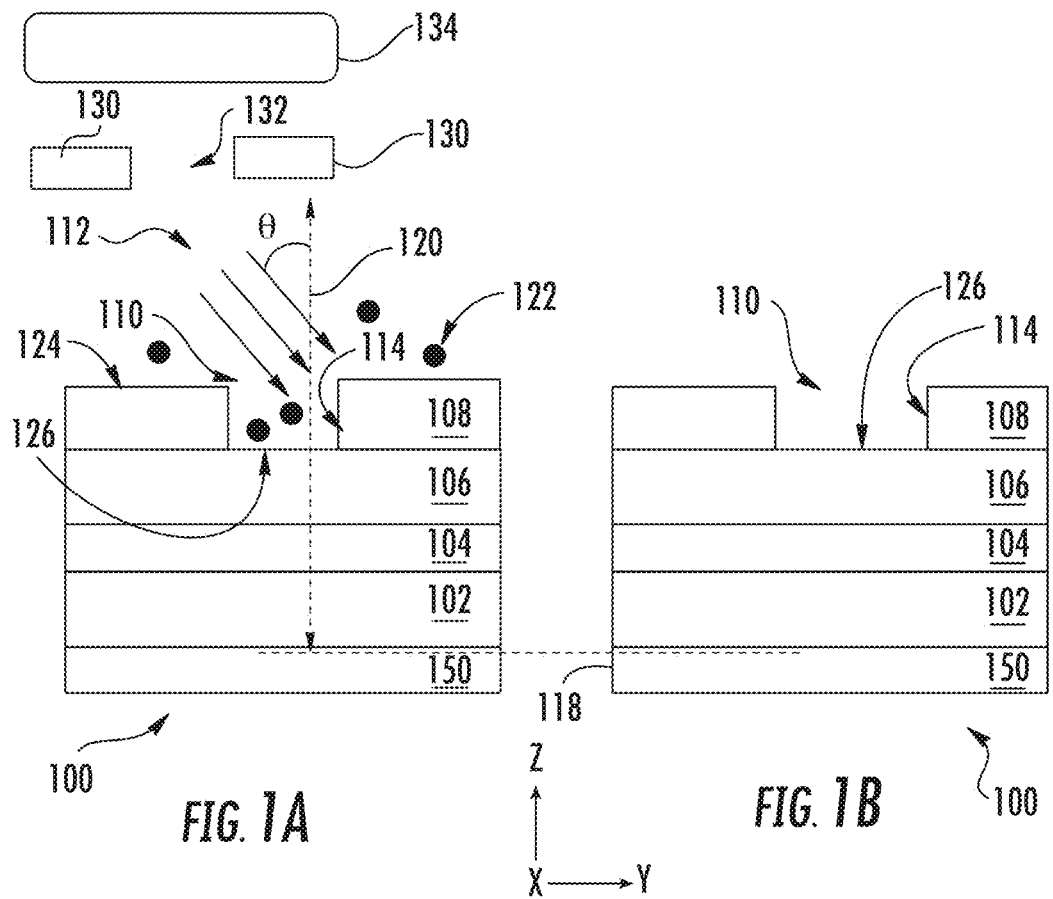
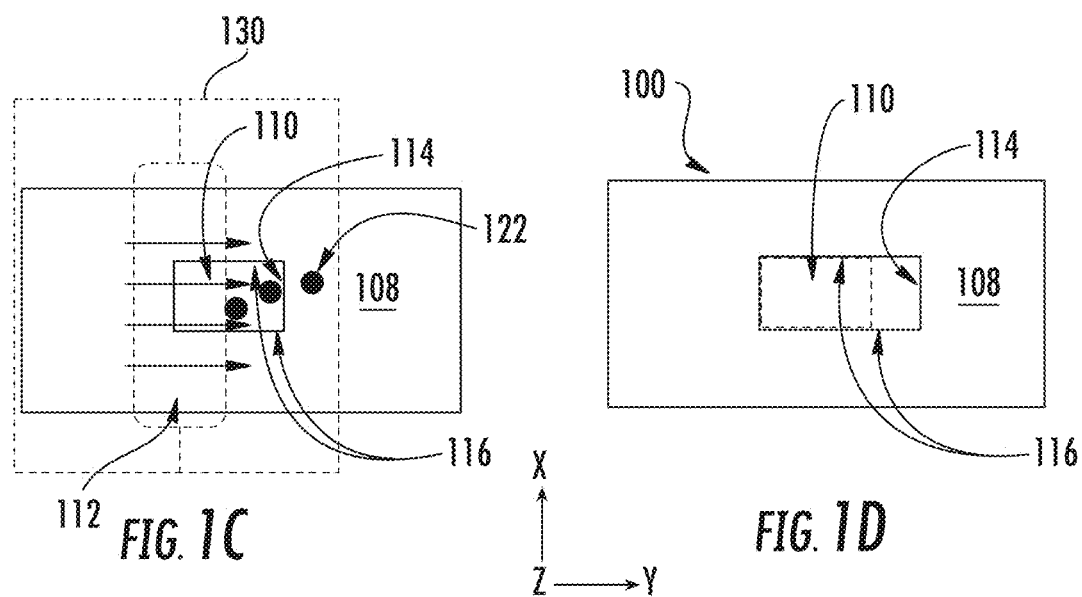

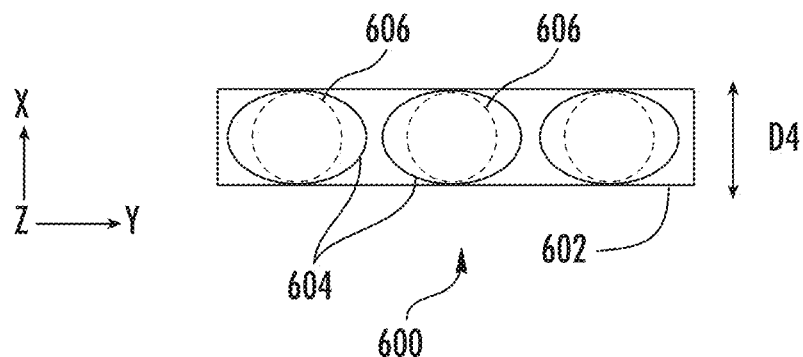
FIG. 6
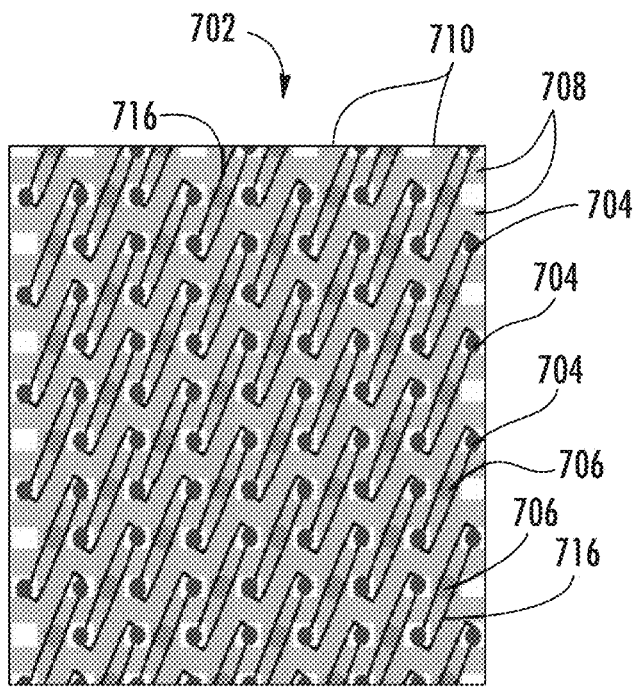
FIG. 7A
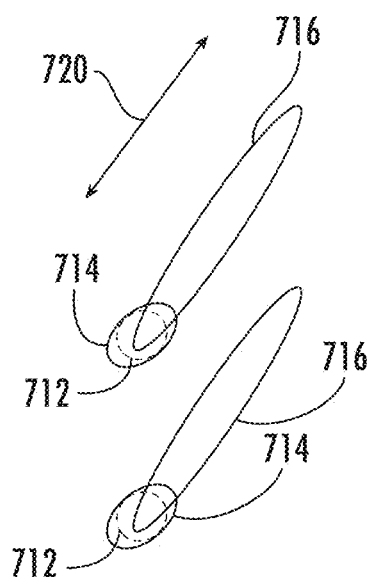
FIG. 7B
| | | |
|---|---|---|
|  BITLINE | ● STORAGE NODE | WORDLINE |
|  ACTIVE |  BITLINE CONTACT | DUMMY WORDLINE |

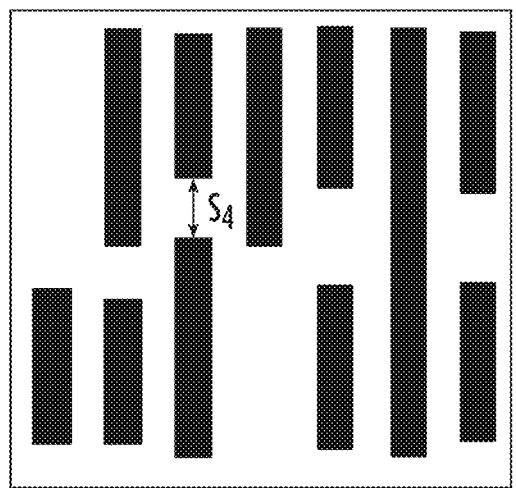
FIG. 8A
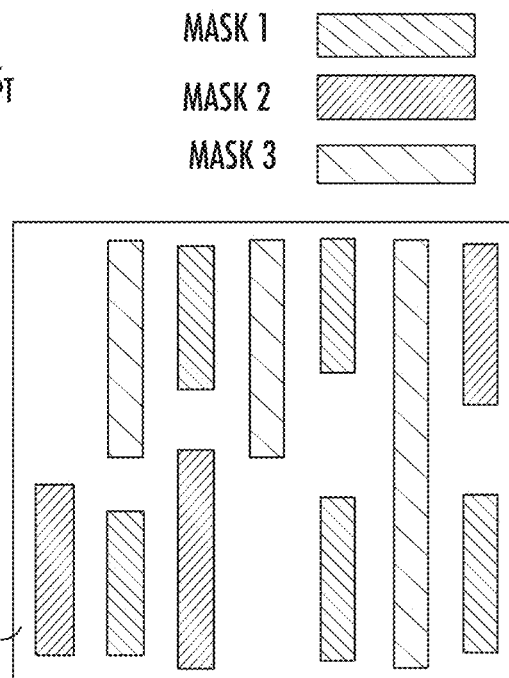
FIG. 8B
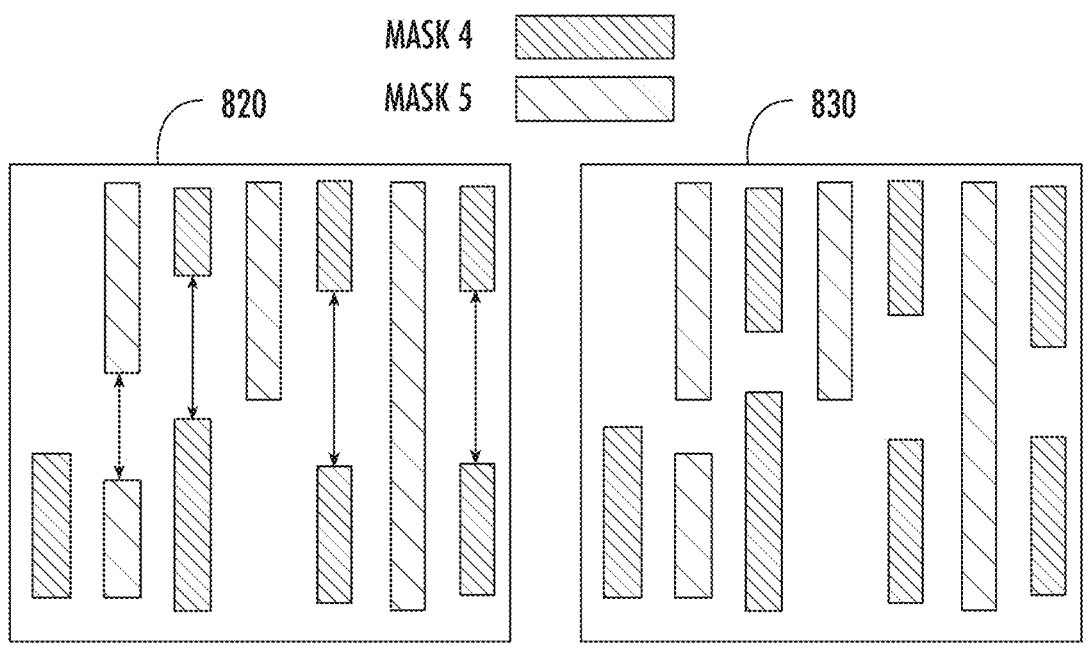
FIG. 8C
FIG. 8D

1000

```
PROVIDING SURFACE FEATURE ON SUBSTRATE, WHERE A SURFACE
FEATURE HAS FIRST DIMENSION ALONG FIRST DIRECTION AND SECOND
DIMENSION ALONG SECOND DIRECTION PERPENDICULAR TO FIRST
               DIRECTION
                 1002
```

```
DIRECTING FIRST IONS IN FIRST EXPOSURE TO SURFACE FEATURE ALONG
  FIRST DIRECTION AT NON-ZERO ANGLE OF INCIDENCE WITH RESPECT TO
PERPENDICULAR TO SUBSTRATE PLANE, IN PRESENCE OF A REACTIVE AMBIENT
 CONTAINING REACTIVE SPECIES, WHEREIN FIRST EXPOSURE ETCHES SURFACE
   FEATURE ALONG FIRST DIRECTION, WHEREIN AFTER DIRECTING, SURFACE
    FEATURE RETAINS SECOND DIMENSION ALONG SECOND DIRECTION, AND
WHEREIN SURFACE FEATURE HAS THIRD DIMENSION ALONG FIRST DIRECTION
                  DIFFERENT THAN FIRST DIMENSION
                             1004
```

FIG. 10

TECHNIQUES TO ENGINEER NANOSCALE PATTERNED FEATURES USING IONS

CROSS-REFERENCE TO RELATED APPLICATION

This application claims priority to and is a divisional of U.S. patent application Ser. No. 15/978,722, filed on May 14, 2018, entitled "TECHNIQUES TO ENGINEER NANOSCALE PATTERNED FEATURES USING IONS", which is a continuation of U.S. patent application Ser. No. 14/749,822, and now patented as U.S. Pat. No. 10,008,384, filed Jun. 25, 2015, entitled "Techniques to Engineer Nanoscale Patterned Features Using Ions," which applications are incorporated herein by reference in their entirety.

FIELD

The present embodiments relate to transistor processing techniques, and more particularly, to processing for three dimensional device formation.

BACKGROUND

As semiconductor devices continue to scale to smaller dimensions, the ability to pattern features becomes increasingly difficult. These difficulties include, in one aspect, the ability to obtain features at a target size for a given technology generation. Another difficulty is the ability to obtain the correct shape of a patterned feature, as well as packing density, and the ability to obtain correct overlay to structures patterned in previous processing operations.

In another example, overlay error represents a challenge to extend lithography to advanced nodes. While multipatterning has been used to address line width and line pitch reduction of features, overlay becomes an increasing challenge. One reason is as the feature line/space is reduced, the overlay requirement becomes smaller. A second reason is as multiple cut masks are coming into use, multiple overlay issues between cut masks and the other features on a substrate arise.

With respect to these and other considerations, the present improvements may be useful.

SUMMARY

This Summary is provided to introduce a selection of concepts in a simplified form further described below in the Detailed Description. This Summary is not intended to identify key features or essential features of the claimed subject matter, nor is the summary intended as an aid in determining the scope of the claimed subject matter.

In one embodiment, a method of patterning a substrate may include providing a surface feature on the substrate, the surface feature having a first dimension along a first direction within a substrate plane, and a second dimension along a second direction within the substrate plane, wherein the second direction is perpendicular to the first direction; and directing first ions in a first exposure to the surface feature along the first direction at a non-zero angle of incidence with respect to a perpendicular to the substrate plane, in a presence of a reactive ambient containing a reactive species; wherein the first exposure etches the surface feature along the first direction, wherein after the directing, the surface feature retains the second dimension along the second direction, and wherein the surface feature has a third dimension along the first direction different than the first dimension.

In another embodiment, a method of patterning a substrate may include providing a layer on the substrate having at least one hole; and directing first ions in a first exposure to the layer along a first direction at a non-zero angle of incidence with respect to a perpendicular to a substrate plane, in a presence of a reactive ambient containing a reactive species, wherein the first exposure increases a first hole dimension of the hole along the first direction using the first ions and reactive ambient, while not increasing a second hole dimension of the hole along a second direction perpendicular to the first direction.

In another embodiment, a method of patterning a substrate may include determining a threshold spacing between adjacent mask features for a lithography process; providing a layer on the substrate; forming a first set of holes using a first lithography mask having spacings between adjacent features no less than the threshold spacing; and directing first ions in a first exposure to the layer along a first direction at a non-zero angle of incidence with respect to a perpendicular to a substrate plane, in a presence of a reactive ambient containing a reactive species, wherein at least two holes of the first set of holes are characterized by a final hole separation along the first direction less than the threshold separation after the first exposure.

BRIEF DESCRIPTION OF THE DRAWINGS

FIG. 1A depicts a side view of processing of a device structure according to various embodiments of the disclosure;

FIG. 1B depicts a side view after processing of the device structure according to the scenario of FIG. 1A;

FIG. 1C depicts a top plan view of the scenario of FIG. 1A;

FIG. 1D depicts a top plan view of the scenario of FIG. 1B;

FIG. 6 illustrates a contact structure formed using one dimensional reactive ion etching according to further embodiments of the disclosure;

FIG. 7A and FIG. 7B depict a further embodiment of the disclosure where one dimensional reactive ion etching is applied to a memory structure;

FIG. 8A illustrates a target device arrangement, shown in plan view;

FIG. 8B illustrates a mask arrangement;

FIG. 8C shows another mask arrangement;

FIG. 8D shows an exemplary trench arrangement;

FIG. 10 depicts an exemplary process flow.

DETAILED DESCRIPTION

Figures 2A, 2B:
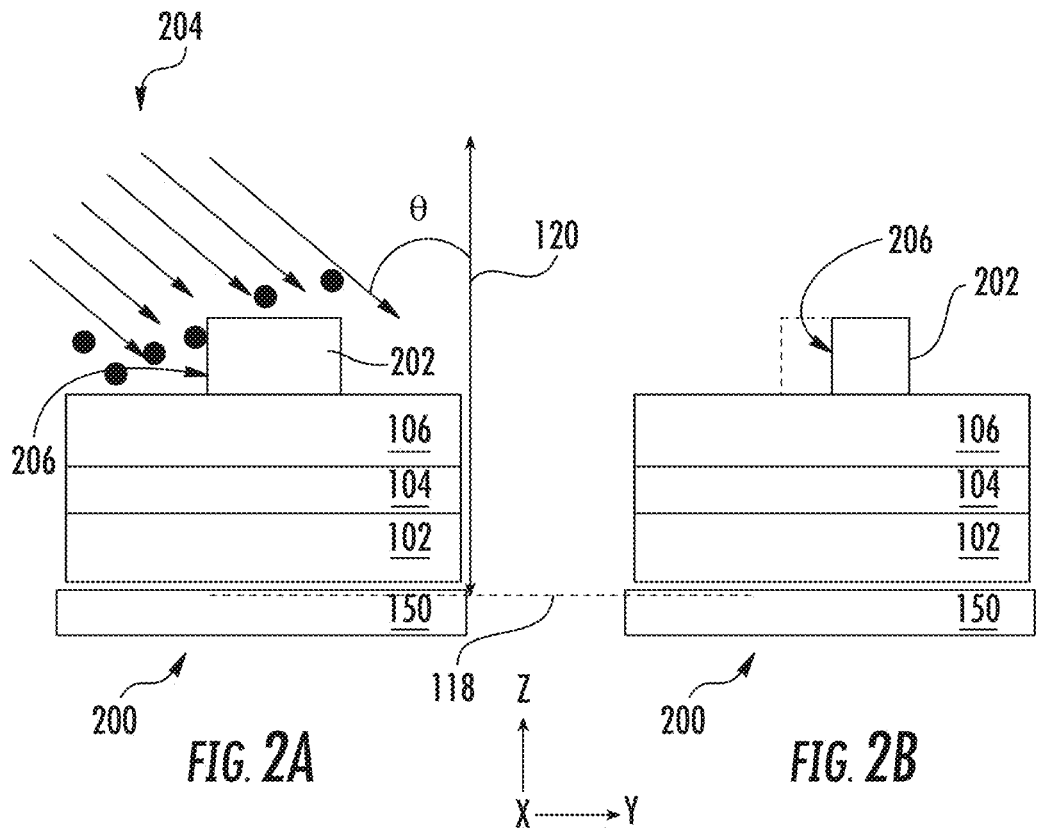
FIG. 2A depicts a side view of processing of a device structure according to various embodiments of the disclosure.
FIG. 2B illustrates a side view after processing of the device structure according to the scenario of FIG. 2A.

The present embodiments will now be described more fully hereinafter with reference to the accompanying drawings, where some embodiments are shown. The subject matter of the present disclosure may be embodied in many different forms and are not to be construed as limited to the embodiments set forth herein. These embodiments are provided so this disclosure will be thorough and complete, and will fully convey the scope of the subject matter to those skilled in the art. In the drawings, like numbers refer to like elements throughout.

This present embodiments provide novel techniques to pattern substrates and in particular novel techniques to etch a feature disposed on a substrate such as a surface feature. As used herein the term "substrate" may refer to an entity such as a semiconductor wafer, insulating wafer, ceramic, as well as any layers or structures disposed thereon. As such, a surface feature, layer, series of layers, or other entity may be deemed to be disposed on a substrate, where the substrate may represent a combination of structures, such as a silicon wafer, oxide layer, and so forth.

In various embodiments, the surface feature may be used for patterning a layer disposed underneath the surface feature. Examples of a surface feature include a hole formed within a layer, such as a via, or trench. In other examples, a surface feature may be a pillar, a line structure (line), or other feature extending above a substrate. The term "hole" may refer to a structure extending through the entirety of a layer, such as a via. The term "hole" may also refer to a structure such as a depression or recess formed within a layer not extending through the entirety of the thickness of a layer. Moreover, the term "layer" as used herein may refer to a continuous layer, a semicontinuous layer having blanket regions and regions of isolated features, or a group of isolated features generally composed of the same material and disposed on a common layer or substrate.

In various embodiments, techniques are provided to modify a surface feature or surface features after lithography processing is performed to form the surface feature(s). This post-lithography processing may overcome shortfalls of known lithography, especially at the nanometer scale, such as for features having minimum dimensions in the range of 2 nm to 100 nm.

In accordance with various embodiments, ions are directed to a layer along a first direction or target direction. The target direction of the ions may be designed to direct the ions to a given surface of a surface feature so as to etch the given surface while not etching other surfaces.

FIG. 1A depicts a side view of processing of a device structure 100 according to various embodiments of the disclosure. FIG. 1C depicts a top plan view of the scenario of FIG. 1A. The device structure 100 may include a first layer 102, second layer 104, third layer 106, and fourth layer 106. These layers may be disposed on a substrate 150. The fourth layer 106 may include a hole 110, where the hole 110 may extend through the entirety of the fourth layer 106. The hole 110 may be formed in the fourth layer 106 using a known lithography technique. The hole 110 may be used to pattern at least one additional layer disposed underneath the fourth layer 106, such as first layer 102, second layer 104, or third layer 106. Examples of fourth layer 106 include photoresist, antireflective coating layer (ARC), silicon nitride, silicon oxide, silicon or other layer. Examples of third layer 106, second layer 104, or first layer 102 include antireflective coating layer (ARC), silicon nitride, silicon oxide, silicon, carbon, photoresist, or TiN. The embodiments are not limited in this context. In particular, an ARC layer or coating may include a mixture of one or more of: carbon, silicon, nitrogen, hydrogen, and oxygen.

In order to pattern an underlying layer, the hole 110 may be provided with suitable dimensions, including a first dimension along a first direction, such as a direction along the Y-axis of the Cartesian coordinate system shown. The hole 110 may also have a second dimension along a second direction, such as along the X-axis. In some instances, increasing the dimension of the hole 110 selectively along a first direction and not along a second direction perpendicular to the first direction may be useful. In the example of FIG. 1A and FIG. 1C the hole 110 may have a rectangular shape within the X-Y plane, representing a plane parallel to a substrate plane 118.

FIG. 1A and FIG. 1C illustrate an exemplary method for increasing a first hole dimension of the hole 110 along the direction parallel to the Y-axis. In particular, as shown in FIG. 1C, ions 112 are directed to the fourth layer 106 along the first direction, i.e., along a direction parallel to the Y-axis. As shown in FIG. 1A, the ions 112 are also directed along trajectories forming a non-zero angle of incidence, shown as the angle θ, with respect to the substrate plane 118. These trajectories allow the ions 112 to strike the sidewall 114 while not striking the sidewalls 116, where the sidewalls 116 may extend parallel to the Y-Z plane. As a result, material from the sidewall 114 may be etched while material from the sidewalls 116 is not etched.

FIG. 1B depicts a side view after processing of the device structure 100 according to the scenario of FIG. 1A. FIG. 1D depicts a top plan view of the scenario of FIG. 1B. As illustrated, along the first direction (parallel to the Y-axis) the hole 110 has a third hole dimension greater than the first hole dimension, while the second hole dimension along the second direction (parallel to the X-axis) remains unchanged. Accordingly, the size of the hole 110 may be extended selectively just along the Y-axis and not along the X-axis.

In accordance with various embodiments, the ions 112 may be directed to the fourth layer 106 in the presence of a reactive ambient containing a reactive species, shown as the reactive species 122, as illustrated by the black dots. The ions 112 and reactive species 122 may be provided by a suitable apparatus capable of providing reactive species as well as a beam of ions. Examples of such apparatus include plasma based apparatus having an extraction system extracting ions through an extraction aperture and directs the ions to a substrate. FIG. 1A illustrates an example of an extraction plate 130 including an extraction aperture 132 for extracting the ions 112 from a plasma 134 and directing the ions 112 to the fourth layer 106. The angle of incidence of the ions 112 with respect to the perpendicular 120 may be controlled by controlling parameters of a plasma system as is known, including plasma power, gas pressure, aperture size, and displacement between different portions of the extraction plate, among other factors. In some examples ions may be extracted having trajectories parallel to one another or differ among themselves by +/−5 degrees. This allows the ions 112 to be directed as a parallel beam of ions along a target direction.

FIG. 1C illustrates a variant of the extraction plate 130 where the extraction aperture 132 is elongated along the second direction parallel to the X-axis, meaning the dimension of the extraction aperture 132 along the X-axis is larger than the dimension of the extraction aperture 132 along the Y-axis. In some examples, the dimension of the extraction aperture 132 along the X-axis may be greater than 100 mm, while the dimension of the extraction aperture 132 along the Y-axis is less than 30 mm. The embodiments are not limited in this context. The ions 112 may accordingly form a ribbon beam having a high degree of uniformity along the X-axis, where the trajectories of ions 112 have a high degree of alignment along the Y-axis as shown. In other words, the ions 112 may form a ribbon beam having a short axis parallel to a first direction (Y-axis) and a long axis parallel to a second direction (X-axis), where the second direction is perpendicular to the first direction.

Additionally, reactive species 122 may be provided as neutrals, ions, radicals, or a combination of neutrals, ions, and radicals. Ions 112 themselves may be inert ions or may include reactive species. The combination of ions 112 and reactive species 122 may include known recipes for performing reactive ion etching of materials including silicon oxide layers, silicon nitride layers, silicon layers, carbon layers, and other materials systems. The embodiments are not limited in this context.

When ions 112 are used in conjunction with reactive species 122, where the reactive species are designed to promote reactive ion etching, this configuration enables a novel "one dimensional reactive ion etching" process where reactive ion etching can be restricted to targeted features on a substrate surface while not affecting other features. The one dimensional reactive ion etching may differ from conventional reactive ion etching where ions directed may etch material along the vertical direction as well as along more than one direction within a plane of the substrate perpendicular to the vertical direction. For example, in conventional reactive ion etching (ashing) of via structures formed within a layer the diameter of via structures may be increased in a non-selective manner along an X-direction and Y-direction.

In the example of FIG. 1A and FIG. 1C etching may take place on surfaces of a select material where reactive species 122 are present as well as ions 112. In particular, at least some of the reactive species 122 may be neutrals where the reactive species may pass through the extraction aperture 132 while not having a particular directionality and may impinge upon various surfaces of the fourth layer 106 as well as the third layer 106 within the hole 110. As discussed above, and in accordance with various embodiments, the ions 112 may be restricted to impinging on the sidewall 114, the top surface 124 of third layer 106, as well as the surface 126 of third layer 106. As regards surface 126, the ions 112 and reactive species 122 may be designed to selectively etch material of the fourth layer 106 with respect to the material of third layer 106, meaning the etch rate of fourth layer 106 differs from the etch rate of third layer 106. In one particular example fourth layer 106 may be silicon oxide and third layer 106 may be silicon nitride. Accordingly, while ions 112 and reactive species 122 may impinge upon surface 126, little or no etching of third layer 106 within hole 110 may take place in the scenario of FIG. 1A to FIG. 1D. Accordingly, after a first exposure to the ions 112 as illustrated in FIGS. 1A and 1C, the layer 108 may exhibit a hole 110 elongated along the Y-axis, where the layer thickness of fourth layer 106 is also reduced. In some embodiments, the fourth layer 106 may be removed in its entirety in subsequent processing. Thus, loss of thickness of fourth layer 106 during the exposure to ions 112 may be acceptable, to the extent adequate thickness remains to pattern underlying layers, such as third layer 106 in subsequent processing. Additionally, because material of fourth layer 106 is removed by a reactive ion etching process, the material of fourth layer 106 once etched may remain volatilized and may not redeposit on other surfaces of the device structure 100, such as in other regions of the hole 110.

Figures 2C, 2D:
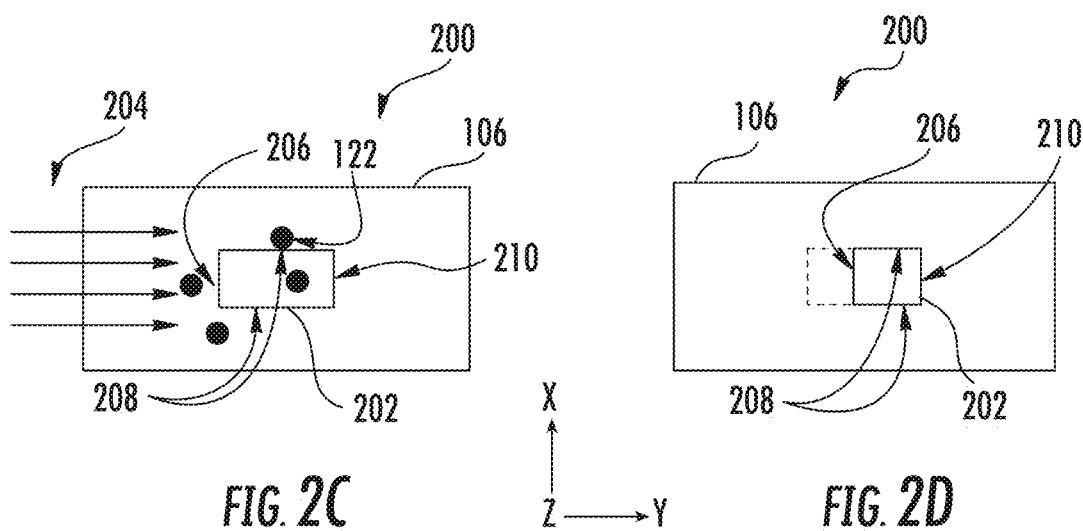
FIG. 2C depicts a top plan view of the scenario of FIG. 2A.
FIG. 2D depicts a top plan view of the scenario of FIG. 2B.

FIG. 2A depicts a side view of processing of a device structure 200 according to various embodiments of the disclosure. FIG. 2C depicts a top plan view of the scenario of FIG. 2A. The device structure 200 may include the first layer 102, second layer 104, third layer 106, and a pillar structure, shown as pillar 202, disposed on the third layer 106. Although a single pillar structure is shown, in various embodiments, a plurality of pillar structures similar to the pillar 202 may be provided on the third layer 106. The pillar structures 202 may be disposed within an additional layer including blanket regions disposed on the third layer 106. These layers may also be disposed on the substrate 150. The pillar 202 may be used to pattern a layer or layers disposed underneath the fourth layer 106, such as first layer 102, second layer 104, or third layer 106. This may be accomplished by forming a lower feature disposed in on the first layer 102, second layer 104, or third layer 106 by vertically etching the pillar 202 along the perpendicular 120.

Since the pillar 202 may be used to define device structure (s) in underlying layers having similar dimensions to the pillar 202, precise control of the dimensions of the pillar 202 may be useful. In various embodiments, the dimension of the pillar 202 along the X-axis, Y-axis, and Z-axis may be on the order of nanometers or tens of nanometers. In some instances, the pillar 202 may be formed using a known lithography process. After the lithography process is complete the relative dimensions of the pillar 202 within the X-Y plane may be as shown in FIG. 2B, where the dimension along the Y-axis is larger than the dimension along the X-axis. As shown the pillar 202 has a rectangular, non-square shape in the X-Y plane. When a target shape for the pillar 202 is square, in accordance with an embodiment of the disclosure, ions 204 may be directed to the pillar 202 as shown in FIG. 2A, and FIG. 2C. The ions 204 may be provided in a manner generally described above with respect to FIGS. 1A and 1C, where the trajectory of ions 204 may be parallel to the Y-axis and may form a non-zero angle of incidence with respect to the perpendicular 120, as shown by the angle θ. This may ensure the sidewall 206 is etched while the sidewalls 208 remain unetched. As a result, the dimension of the pillar 202 may be selectively reduced along the Y-axis while the dimension of the pillar 202 along the X-axis remains the same. In the example of FIG. 2D the exposure to ions 204 may result in generating a square shape to the pillar 202 in the X-Y plane. Additionally, because the ions 204 are provided in the presence of the reactive species 122, the ions 204 may selectively etch the pillar 202 so as not to etch the third layer 106 or to etch the third layer 106 at a much lower rate than the rate of etching of the pillar 202. In other embodiments an array of lines formed on a substrate where the width of the lines along a short direction of the lines is greater than a target linewidth. The array of lines may be subjected to one dimensional reactive ion etching where ions are directed toward lines in a direction perpendicular to a long direction of the lines. This may selectively reduce the linewidth of the lines along the short direction of the lines while not reducing the line length, allowing for a close tip-to-tip spacing between adjacent lines, while generating the target linewidth.

Figure 3A:
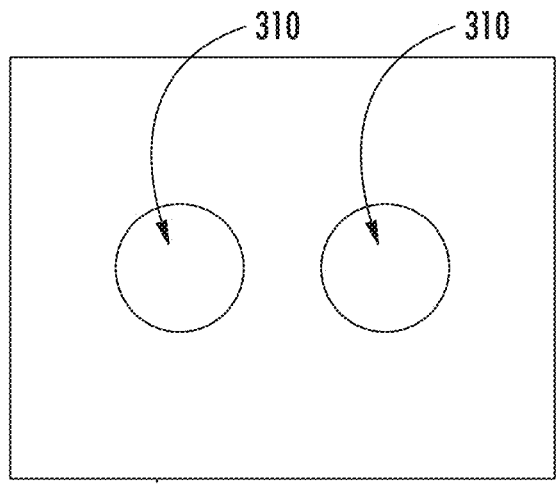
FIG. 3A to FIG. 3D illustrate another example of one dimensional reactive ion etching according to further embodiments of the disclosure.
Figure 3B:
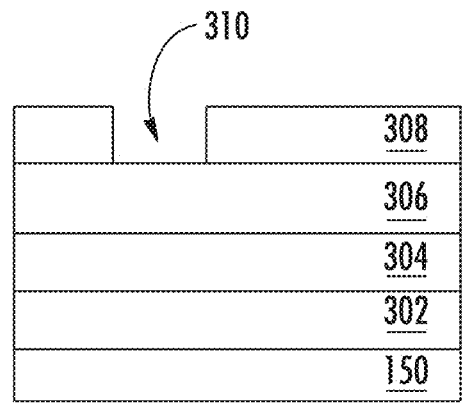
Figure 3C:
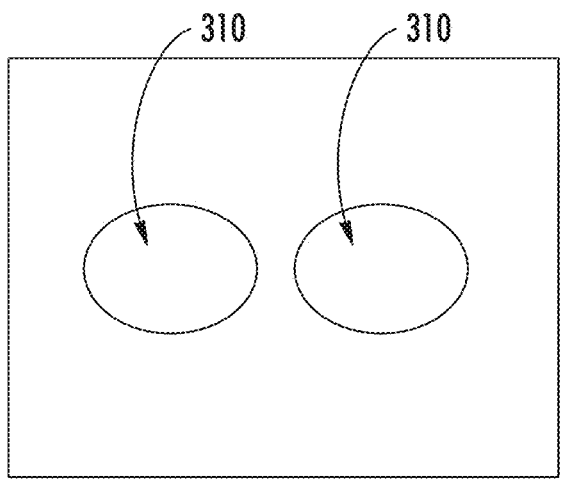
Figure 3D:
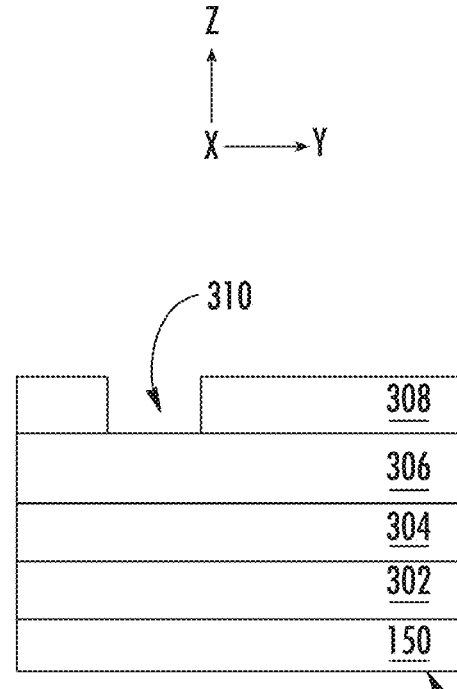

FIG. 3A to FIG. 3D illustrate another example of one dimensional reactive ion etching according to further embodiments of the disclosure. FIG. 3A depicts a side view of an initial state of a device structure 300 according to various embodiments of the disclosure. FIG. 3B depicts a top plan view of the scenario of FIG. 3A. FIG. 3C depicts a side view of a final state of the device structure 300 after processing by ions as generally described above with respect to FIGS. 1A-2D. FIG. 3D depicts a top plan view of the scenario of FIG. 3C. In the initial state shown in FIGS. 3A-3B, the device structure 300 includes a substrate 150, first layer 302, second layer 304, third layer 306, and fourth layer 308. A pair of holes shown as the holes 310 are provided within the fourth layer 308. The holes 310 may be provided as vias extending through the entirety of the fourth layer 308. The holes 310 may have a circular shape in the X-Y plane as shown. After processing with ions (not shown for clarity) the dimension of the holes 310 may be selectively increased along the Y-axis while not being increased along the X-axis, as shown in FIGS. 3B and 3D.

Figures 4A, 4B:
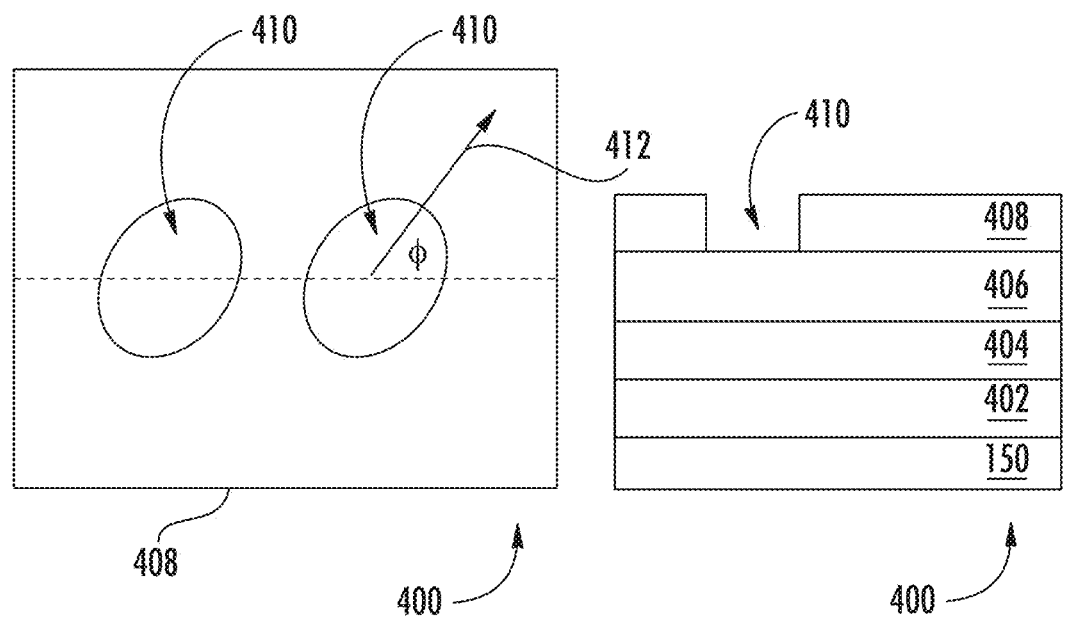
FIG. 4A and FIG. 4B illustrate another example of one dimensional reactive ion etching according to further embodiments of the disclosure.

FIG. 4A and FIG. 4B illustrate another example of one dimensional reactive ion etching according to further embodiments of the disclosure. FIG. 4A depicts a side view of a final state of a device structure 400 according to various embodiments of the disclosure after being subject to a one dimensional reactive ion etching as described above with respect to FIGS. 1A to 2D. FIG. 4B depicts a top plan view of the scenario of FIG. 4A. The device structure 400 includes a substrate 150, first layer 402, second layer 404, third layer 406, and fourth layer 408. A pair of holes shown as the holes 410 are provided within the fourth layer 408. The holes 410 may be provided as vias extending through the entirety of the fourth layer 408. For reference, an initial state of the holes 410 may have a circular shape in the X-Y plane as shown, for example, at FIG. 3A and FIG. 3B. In this embodiment, different from prior embodiments, the ions (not shown) may be directed along a direction 412 forming a non-zero angle with respect to the Y-axis and the X-axis, shown as the angle φ. In one example, this angle may be 45 degrees, so the holes 410 assume an elliptical shape having a long axis oriented at 45 degrees with respect to the X-axis or Y-axis. In the above manner an array of holes arranged along an X-Y grid may be lengthened along any direction forming a target angle with respect to the X-axis or Y-axis. According to different embodiments, this may be accomplished by rotating a substrate about the Z-axis until the target angle is formed.

In various embodiments, including variants of the aforementioned embodiments of FIGS. 1A to 4B, where a substrate may include a plurality of layers, one dimensional reactive ion etching may be performed within any layer. For example, referring again to FIG. 2A and FIG. 2B, transferring the shape of the pillar 202 into the substrate 150 may be a goal. Accordingly, starting with the pillar 202 as shown in FIG. 2A, rather than performing one dimensional reactive ion etching on the pillar 202, a known vertical reactive ion etching process may be performed wherein ions are directed along the Z-axis to transfer the shape and size of pillar 202 of FIG. 2A into the third layer 106. Subsequently, a pillar formed in third layer 106 having the shape and size of the pillar 202 of FIG. 2A may be subject to one dimensional reactive ion etching to generate a pillar within the third layer 106 having the shape and size of the pillar 202 in FIG. 2B. This pillar within the third layer 106 may then be transferred by vertical reactive ion etching to the second layer 104, first layer 102, and finally substrate 150. Alternatively, beginning with the structure of FIG. 2A, third layer 106 and second layer 104 may be subject to vertical reactive ion etching, forming a pillar structure in second layer 104. The pillar structure in second layer 104 may then be subject to one dimensional reactive ion etching to form a pillar having the shape and size of pillar 202 of FIG. 2B. Subsequently further vertical reactive ion etching may be performed to transfer the pillar of second layer 104 into first layer 102 and substrate 150; and so forth.

Likewise, in embodiments where one dimensional reactive ion etching is used to generate an elongated hole, the elongated hole may be formed in any given layer of a layer stack, while vertical etching is used to from a lower hole having the shape and size of the elongated hole in a layer disposed underneath the elongated hole.

In further embodiments of the disclosure, one dimensional reactive ion etching may be performed using a pair of ion beams directed parallel to a common axis, such as the Y-axis. The pair of ion beams may form a mirror image about the X-Z plane so the ion beams strike opposite surfaces of a surface feature. For example, known plasma apparatus may be employed to etch a surface feature, where the plasma apparatus provide two parallel elongated apertures where ions are extracted from a plasma at an angle of incidence of +q and −q with respect to the perpendicular 120. Turning again to FIG. 2C and FIG. 2D, ions may be directed along the Y-axis from the left of the figures to strike the sidewall 210, as well as sidewall 206. In this manner the pillar 202 may be etched from opposite sides. In other embodiments, a similar procedure may be employed to etch opposing sides of a hole.

Figure 5A:
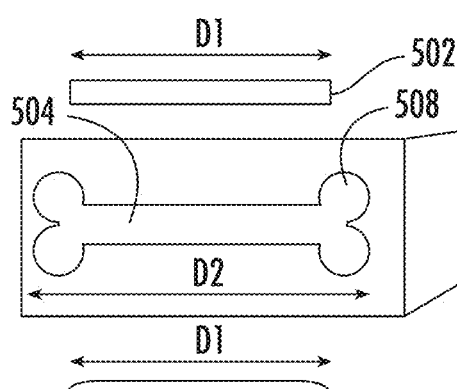
FIGS. 5A to 5D depict another embodiment where one dimensional reactive ion etching may be used to generate an array of holes.

FIGS. 5A to 5D depict another embodiment where one dimensional reactive ion etching may be used to generate an array of holes having a target dimension. One issue encountered by known lithography techniques is the ability to generate a target shape in a layer based upon mask shape. Proximity correction is often used to generate a mask having a different shape than a target shape in a layer. FIG. 5A depicts a target shape 502, in this case a rectangle, to be imparted into a layer on a substrate. FIG. 5A also shows a proximity corrected mask feature, mask feature 504, used to generate the target shape 502. The mask feature 504 includes distal portions 508 creating a bone shape in the mask feature 504. Additionally, the width D2 of the mask feature 504 is greater than the width D1 of the target shape. This difference is size and shape between the mask feature 504 and target shape 502 may be due to known optical effects. FIG. 5A further depicts a final shape 506 generated by the mask feature 504, where the final shape 506 approximates the target shape 502. In one example, the final shape 506 may be the shape of a trench patterned using the mask feature 504. As shown, the width of the final shape 506 may be D1 and may be less than the width D2 of the mask feature 504.

Figure 5B:
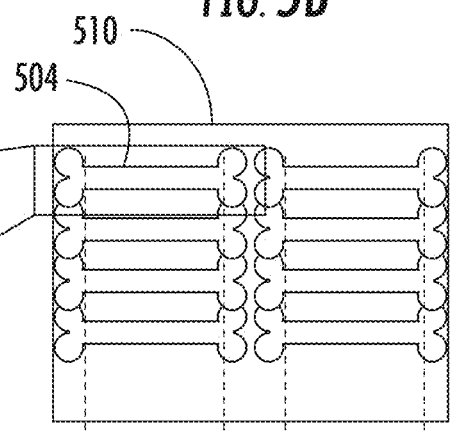

By way of reference, in known processing approaches a problem may be encountered when an array of features is to be generated by proximity correction masks where the array of features is to be closely spaced. For example, because the width D1 exceeds the width D2, when proximity mask features 504 are placed adjacent one another a minimum spacing between adjacent features patterned by the proximity mask features is approximately 2× (D2−D1). This issue is further illustrated in FIG. 5B. In FIG. 5B there is shown a proximity mask 510 including a two dimensional array of mask features 504. Two columns of mask features 504 are shown where a mask feature 504 in the left column is disposed end-to-end adjacent a corresponding mask feature in the right column, also shown as mask feature 504. FIG. 5C illustrates a patterned layer 520 having a plurality of trenches, where the patterned layer is formed using the proximity mask 510. As illustrated, two columns of trenches 522 are formed having a width D1 as discussed above. Because D1 is less than D2, a column within the same row (along the Y-axis) is separated from an adjacent column by a separation S1, equal to approximately 2× (D2−D1), assuming the mask features 504 of proximity mask 510 abut one another.

Figure 5D:
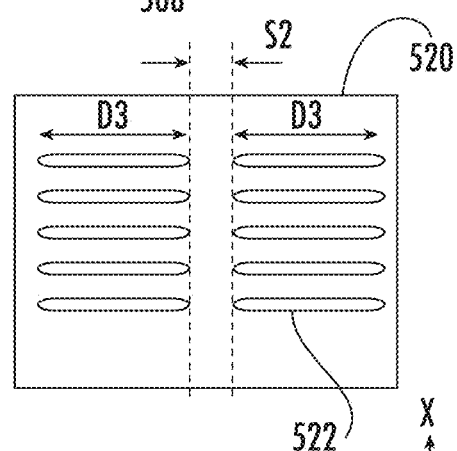
Figure 5C:
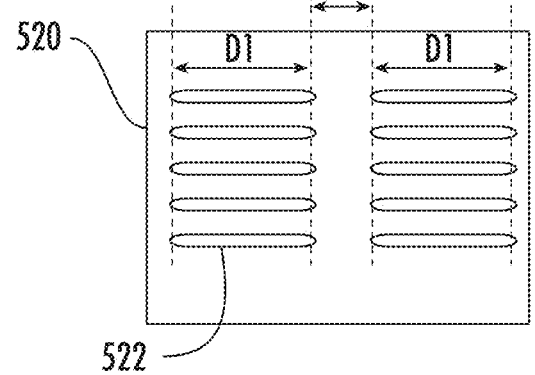

In some applications, the separation of trenches 522 as shown in FIG. 5C may exceed a design rule or a target separation, such as separation S2, discussed with respect to FIG. 5D. Known processing approaches to not provide adequate solutions to address this problem. According to an embodiment of the disclosure, one dimensional reactive ion etching may be used to selectively widen the trenches 522 along the Y-axis, while not widening the trenches along the X-axis. FIG. 5D illustrates an example of a final structure of the patterned layer 520, generated by applying one dimensional reactive ion etching as detailed above to the patterned layer 520 of FIG. 5C. As shown, the trenches 522 now have a width D3 greater than D1 and serves to generate a spacing S2 between adjacent trenches smaller than the spacing S1. In the above manner, the present embodiments provide closer packing of surface features such as trenches along a given direction while not unduly widening the trenches along a perpendicular direction.

In various additional embodiments, the length of a trench may be lengthened symmetrically by providing ions directed to opposite ends of the trench, or may be lengthened along just one end or the other end by providing ions directed just to the selected end of the trench. The same applies to other types of holes. In the case of symmetric lengthening of a hole, a first ion exposure may be provided by an ion beam directed to a substrate such as a wafer, in order to etch a first end of a trench. The wafer may then be rotated 180 degrees for a second exposure to the ion beam, where the second end of the trench is etched, while the ion beam retains the same angle of incidence θ, between exposures. Alternatively, a pair of ion forming a mirror image about the X-Z plane may be provided in a single exposure so the ion beams strike opposite ends of a trench.

FIG. 6 illustrates a contact structure formed using one dimensional reactive ion etching according to further embodiments of the disclosure. In FIG. 6 there is shown a top plan view of a device structure 600. The device structure 600 may represent a source/drain (S/D) contact structure of a transistor. In the example of FIG. 6 a source/drain region 602 has a narrow shape, elongated along the Y-axis. FIG. 6 also depicts an array of contact holes, shown as contact vias 604, where the contact vias 604 may include metallic contacts used to contact the source/drain region 602. According to an embodiment of the disclosure, contact vias 606, initially formed in a patterning layer (not shown), may initially have a circular shape. The diameter of initial contact vias having a circular shape may be limited by the width D4 of the source/drain region 602. Because of this, circular contacts formed using the contact vias 606 may have insufficient contact area to generate a low contact resistance to the source/drain region 602. Using one dimensional reactive ion etching to increase the size of contact vias along the Y-axis, the contact vias 606 may be transformed into the contact vias 604. As shown, the contact vias 604 have an elliptical shape and an overall area greater than the contact vias 606. Additionally, because etching is performed by directing ions parallel to the Y-axis, the contact vias 604 do not extend beyond the source/drain region 602 along the X-axis.

FIG. 7A and FIG. 7B depict a further embodiment of the disclosure where one dimensional reactive ion etching may be used to improve contacts in a memory structure. In FIG. 7A there is shown a plan view of a memory array 702, including wordlines 708 running horizontally in the figure, and bitlines 710 running vertically. The memory array further includes bitline contacts 706 and storage node contacts 704. In the memory array 702 active regions 716 elongated along a direction forming a non-zero angle with respect to the vertical or horizontal directions. FIG. 8B depicts a close-up showing two active regions 716. Because contacts such as the storage node contacts 704 may be formed using a different mask to pattern a layer than a mask used to define the active regions 716, overlap and placement of the storage node contacts 704 may be a concern. FIG. 8B shows an outline of the shape of initial contact hole 712 formed by known lithographic patterning.

The initial contact hole may be increased in size in a selective manner by performing one dimensional reactive ion etching according to embodiments of the disclosure. For example, ions (not shown) may be provided along the direction 720 to increase the size of the initial contact hole 712, generating an elongated contact hole, shown as contact hole 714. The contact hole 714 may increase area of the storage node contact 704, as well as increasing overlap with the active region 716, while not increasing the size of the initial contact hole 712 in a direction perpendicular to the direction 720. This may ensure a given contact hole does not overlap with an adjacent active region. Accordingly, the one dimensional reactive ion etching of the initial contact holes 712 may generate lower contact resistance due to increased area, as well as corrections in misalignment between initial contact holes 712 and active regions 716.

In further embodiments, one dimensional reactive ion etching may be employed to reduce process complexity, including reducing the number of masks used to generate a given set of device structures. By way of reference, in known processing approaches, especially for patterning small and closely packed structures having dimensions and separations on the order of tens or nanometers or less, generating a given set of device structures within a given level may entail using multiple masks. This is because a target spacing between features may be smaller than the spacing achievable by exposing a single mask. When features are spaced below a given separation on a given mask, the features may not be properly imaged within a given resist layer. Accordingly, design rules for a mask may specify a threshold separation of mask features, $S_T$, in order to properly define the target features within a layer such as photoresist. For example, for a mask to generate a dense array of local interconnect features, a threshold separation may be 10 nm for a given lithography tool, given resist layer. Once a threshold separation is specified or determined, a given mask to pattern a layer may include mask features spaced apart by a distance at least $S_T$. When a group of device features is to be generated in a substrate at a given level, and the target separation of at least some of the device features is smaller than $S_T$, the complete group of device features may be generated by exposing a layer to multiple masks where features produced by a first mask may be interleaved with features produced by a second mask, while the separation between features in a given mask is not below $S_T$. In conventional processing a disadvantage of this approach is because multiple masks may be employed to generate device features within a given level, adding to cost and complexity.

FIG. 8A illustrates a target device arrangement, shown in plan view as the device arrangement 800. In some examples, the device arrangement 800 may represent a local interconnect pattern formed on a given level of an integrated circuit device. As illustrated the device arrangement 800 includes an array of rectangles (or "lines") where the size of lines and distance between adjacent lines may vary. As further illustrated, the distance between adjacent lines may be less than $S_T$, as shown by the distance S4 between two adjacent lines. Accordingly, the use of a single mask to produce the device arrangement 800 may be difficult because of the proximity of adjacent lines. FIG. 8B shows an initial approach to address this issue by using three different masks to pattern different groups of lines, where the different groups of lines together constitute the group of lines in the device arrangement 800. The three different masks are shown as mask 1, mask 2, and mask 3. Mask 1 may have, for example, five lines mutually spaced from one another at distances at least as great as $S_T$. The lines may be spaced apart from one another by a distance greater than $S_T$ both along the X-axis and Y-axis. Mask 2 may have three lines while mask 3 also has three lines, where the lines are also spaced apart from one another in a given mask so as to be greater than or equal to ST. The patterns of lines with the different masks are displaced from one another to generate the device arrangement 800. Accordingly, a line from one mask may be placed at a spacing less than $S_T$ from a line formed by another mask, since the lines are formed in different masks.

In accordance with an embodiment of the disclosure, the number of masks to generate the device arrangement 800 may be reduced by using one dimensional reactive ion etching. Turning now to FIG. 8C there is shown a mask arrangement 820. The mask arrangement 820 includes a pattern of lines formed from two different masks, mask 4 and mask 5. The different lines from the two different masks may be used to generate the device arrangement 800 in the following manner. As illustrated, the lines in mask arrangement 820 are mutually spaced from one another as shown by the arrows, where the tip-to-tip distance between adjacent lines within a given mask along the direction of the arrows is at least as large as $S_T$. The lines of the mask 4 may be interspersed with lines of mask 5 in order to provide adequate spacing between adjacent lines within a given mask perpendicular to the direction of the arrows. Accordingly, the mask arrangement 820 may be used by conventional lithography to generate a pattern of trenches having a same shape, size, and separation of the lines of mask arrangement 820. This pattern of trenches may be generated using just two masks, mask 4 and mask 5. In order to generate a pattern of trenches matching the device arrangement 800, the pattern of trenches as represented by mask arrangement 820 may be subject to one dimensional reactive ion etching where ions are directed along the direction of the arrows of FIG. 8C.

FIG. 8D shows an exemplary trench arrangement, designated as trench arrangement 830, where trenches having the initial structure of the mask arrangement 820 have been etched to increase their dimension along the direction of the arrows. In this manner the final tip-to-tip spacing among adjacent lines may be less than $S_T$. The trench arrangement 830 may be seen to match the device arrangement 800. Additionally, because etching does not take place in a direction perpendicular to the arrows, the width of the trenches may be preserved along the direction perpendicular to the arrows may be preserved. Accordingly, the number of masks used to generate the device arrangement 800 may be reduced by taking advantage of the ability of one dimensional reactive ion etching to decrease tip-to-tip separation of adjacent features. In addition to decreasing process complexity the reduction in number of masks helps avoid overlay problems between different mask levels. For a given overlay error per mask, the reduction on the number of masks to generate a given pattern reduces the total overlay error, since the overlay errors accumulate in an additive fashion between different masks.

In further embodiments, the number of mask sets used to generate a given arrangement with a given level may be reduced from two to one masks, or from four to three masks. The embodiments are not limited in this context. More generally, the present embodiments include a method of forming a first set of holes using a first lithography exposure employing a first lithography mask, wherein at least two holes of the first set of holes are characterized by a final hole separation along a first direction less than a threshold separation for features patterned in a first layer using the first lithography exposure. As noted above, this final hole separation may be reduced below the threshold separation by etching the holes using a one dimensional reactive ion etching process as detailed above with respect to FIGS. 8A to 8D, for example. Additionally, in further embodiments, a method may involve employing a second lithography mask in addition to the first lithography mask to define a second set of holes in the first layer using a second lithography exposure, where the second set of holes are interspersed with the first set of holes. The second set of holes may be characterized by a second final hole separation less than the threshold separation for features patterned in the first layer using the second lithography exposure.

Figure 9A:
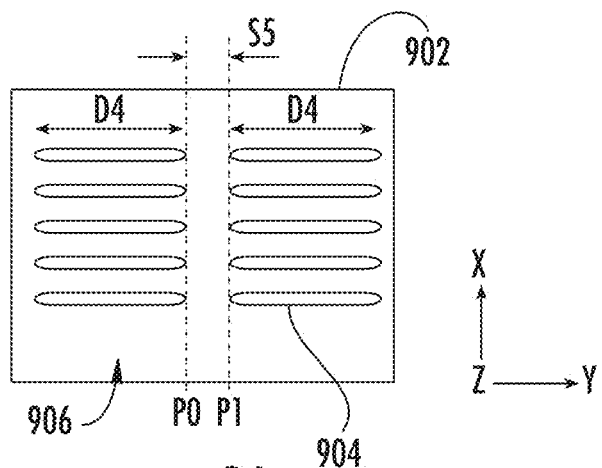
FIG. 9A depicts a top plan view of an array of lines before processing.

In additional embodiments one dimensional reactive ion etching may be applied to an array of features such as lines, mesas, or pillars extending above another layer. In some examples one dimensional reactive ion etching may be applied along one direction or along a pair of directions where the ions are directed along opposite directions while parallel to an axis, such as the Y-axis of the aforementioned embodiments. In particular embodiments, one dimensional reactive ion etching may be applied to alter the length of lines, such as the length of lines in an array of lines. This may facilitate in adjusting the tip-to-tip spacing between adjacent lines in an array. FIG. 9A depicts a top plan view of an array of lines before processing. In this example, an array 906 of lines 904 is arranged on a substrate 902. The array 906 may extend along the Z-axis above a layer of the substrate 902, as shown for the pillar structures 202 of FIG. 2A. The array 906 is a two dimensional array where the lines 904 have neighbors along the X-axis as well as along the Y-axis. The lines 904 have a relatively greater dimension along the Y-axis and may be deemed to extend along the Y-axis. The lines 904 may be characterized by a tip-to-tip spacing, shown as the spacing S5. The array 906 may be formed by a lithographic process as described above. The spacing S5 may differ from a target tip-to-tip spacing, designated as S6. In order to adjust the tip-to-tip spacing, ions may be directed in a one dimensional reactive ion etch according to the present embodiments as detailed above. In one example, ions may be directed along opposite trajectories with respect to the Y-axis, where the trajectories of the ions are parallel to the Y-axis. The ion trajectories may form a non-zero angle of incidence with respect to the perpendicular 120 (see FIG. 2A), so ends of the lines are impacted by the ions.

Figure 9B:
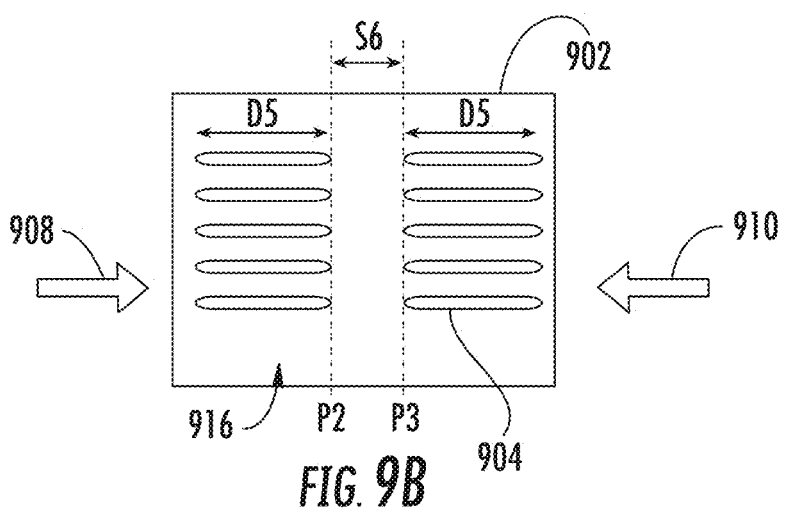
FIG. 9B depicts a top plan view of the array of lines of FIG. 9A after one dimensional reactive ion etching according to one embodiment.

FIG. 9B depicts a top plan view of the array of lines of FIG. 9A after one dimensional reactive ion etching according to one embodiment. In this example, ions 908 are directed along one set of trajectories parallel to the Y-axis, as shown by the arrow directed to the right, while ions 910 are directed along a second set of trajectories parallel to the Y-axis, opposite the first set of trajectories, as shown by the arrow directed to the left. As illustrated, the tip-to-tip spacing of the lines 904 has been increased to a spacing S6, representing the target tip-to-tip spacing. Because the ions 910 and ions 908 are directed to the lines 904 along opposite trajectories, opposite tips of lines 904 may be etched equally. As shown in FIG. 9A the left column of lines 904 initially has right tips at position P0, while the right column of lines 904 initially has left tips at position P1. After etching according to the scenario of FIG. 9B, the left column of lines 904 has right tips at position P2, shifted to the left along the Y-axis with respect to P0, while the right column of lines 904 has left tips at position P3, shifted to the right along the Y-axis with respect to P1. In this manner, an array 916 of the lines 904 is created, where the tip-to-tip spacing between adjacent lines along the Y-axis is adjusted in a symmetrical manner with respect to the array 906.

Figure 9C:
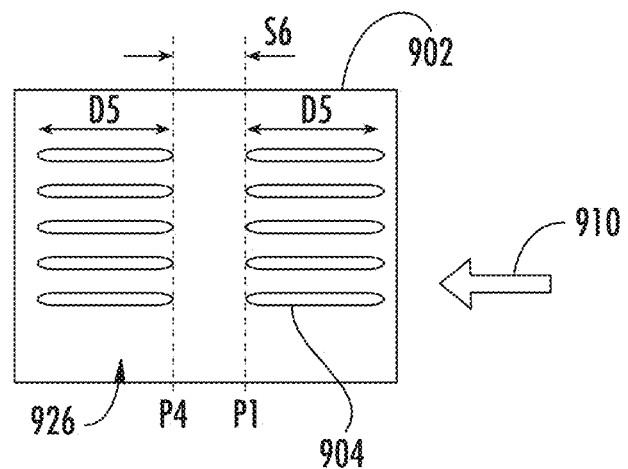
FIG. 9C depicts a top plan view of the array of lines of FIG. 9A after one dimensional reactive ion etching according to another embodiment.

FIG. 9C depicts a top plan view of the array of lines of FIG. 9A after one dimensional reactive ion etching according to another embodiment. In this example, just the ions 910 are directed along the second set of trajectories parallel to the Y-axis. As illustrated, the tip-to-tip spacing of the lines 904 has also been increased to a spacing S6, representing the target tip-to-tip spacing. Because just the ions 910 are directed to the right tips of lines 904, just the right tips of lines 904 may be etched, while the left tips of the lines 904 remain unetched. After etching according to the scenario of FIG. 9C, the left column of lines 904 has right tips at position P4, shifted to the left along the Y-axis with respect to P0, while the right column of lines 904 has left tips at position P1, remaining unshifted with respect to the original position of the left tips of right column of lines 904. In this manner, an array 926 of the lines 904 is created, where the tip-to-tip spacing between adjacent lines along the Y-axis is adjusted in an asymmetrical manner with respect to the array 906. This latter scenario of FIG. 9C may be useful in circumstances where the average position of a whole group of features is to be shifted while also adjusting the spacing between features.

FIG. 10 depicts an exemplary process flow 1000. At block 1002, providing a surface feature on substrate takes place, where the surface feature has a first dimension along a first direction and a second dimension along a second direction perpendicular to the first direction. The surface feature may be, for example, a line, a pillar, a mesa, a hole or other feature. At block 1004 directing first ions in a first exposure to the surface feature takes place along a first direction at a non-zero angle of incidence with respect to a perpendicular to a substrate plane. The directing of the first ions takes place in the presence of a reactive ambient containing reactive species, wherein after the directing, the surface feature retains the second dimension along the second direction, and wherein surface feature has a third dimension along the first direction different than the first dimension.

The present embodiments provide various advantages over conventional processing to define features in a substrate. One advantage lies in the ability to perform one dimensional trimming of a surface feature where a first dimension of a second dimension of a surface feature perpendicular to the first dimension. For example, a width of a line may be reduced while not reducing a length of the line.

Another advantage is the ability to reduce spacing between adjacent features below the spacing achieved by known lithography processes. An example of this ability is the reduction of tip-to-tip separation between adjacent trenches such as contact trenches. A further advantage is the ability to reduce the number of masks used to generate a pattern of features, where the features may be separated by a distance less than the threshold separation achievable by a single mask. This reducing the number of masks has the further advantageous effect of reducing overlay error for printing the pattern of features.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are in the tended to fall within the scope of the present disclosure. Furthermore, the present disclosure has been described herein in the context of a particular implementation in a particular environment for a particular purpose, while those of ordinary skill in the art will recognize the usefulness is not limited thereto and the present disclosure may be beneficially implemented in any number of environments for any number of purposes. Thus, the claims set forth below are to be construed in view of the full breadth and spirit of the present disclosure as described herein.

What is claimed is:

1. A method of patterning a substrate, comprising:
providing a first layer directly on a second layer in the substrate, the first layer comprising a plurality of holes, isolated from one another, the second layer comprising a continuous layer or a semicontinuous layer, extending under a portion of the first layer and having an upper surface that is exposed within the at least one hole in the first layer; and
directing first ions in a first exposure to the first layer and the upper surface of the second layer along a trajectory, the trajectory forming a non-zero angle of incidence with respect to a perpendicular to the substrate plane, wherein the trajectory is aligned along a first direction within the plane of the substrate, the first exposure comprising a reactive ion etch, wherein the first exposure increases a first hole dimension of the plurality of holes by selectively etching the plurality of holes along the first direction, with respect to a second direction, perpendicular to the first direction .

2. The method of claim 1, wherein the first ions form a ribbon beam having a long axis parallel to the second direction and a short axis parallel to the first direction.

3. The method of claim 1, comprising:
after the first exposure, performing an etch to transfer the at least one hole into the second layer, wherein the etch takes place in a vertical direction along the perpendicular to the plane of the substrate.

4. The method of claim 1, wherein the trajectory comprises a first trajectory, wherein the first exposure further comprises directing second ions to the surface feature along a second trajectory, opposite the first trajectory, at a non-zero angle of incidence with respect to the perpendicular.

5. The method of claim 1, wherein the plurality of holes comprises a set of contact holes in a memory array.

6. The method of claim 1, wherein the plurality of holes comprises an array of trenches,
wherein, before the first exposure, the array of trenches are characterized by a first spacing, wherein, after the first exposure, the array of trenches are etched along the first direction and are characterized by a second spacing along the first direction, less than the first spacing.

7. The method of claim 6, wherein the array of trenches are not etched along a second direction, perpendicular to the first direction.

8. The method of claim 6, wherein the array of trenches comprises a first position before the first exposure, and a second position after the first exposure, shifted along the first direction with respect to the first position.

9. The method of claim 6, wherein the trajectory comprises a first trajectory, wherein the first exposure further comprises directing second ions to the surface feature along a second trajectory, opposite the first trajectory, at a non-zero angle of incidence with respect to the perpendicular, wherein a position of the array of trenches is not shifted by the first exposure.

10. A method of patterning a substrate, comprising:
providing a layer on the substrate, the substrate defining a substrate plane, the layer comprising a plurality of holes, isolated from one another, wherein a given hole of the plurality of holes defines a first hole dimension along a first direction; and
directing first ions in a first exposure to the first layer along a trajectory, the first exposure comprising a directional ion etch, wherein the first exposure increases the first hole dimension by selectively etching a sidewall of the plurality of holes along the first direction, with respect to a second direction, perpendicular to the first direction;
wherein the directional ion etch etches an entire thickness of the layer.

11. The method of claim 10, wherein the trajectory forms a non-zero angle of incidence with respect to a perpendicular to the substrate plane, wherein the trajectory is aligned along the first direction.

12. The method of claim 11, wherein the trajectory comprises a first trajectory, wherein the first exposure further comprises directing second ions to the surface feature along a second trajectory, opposite the first trajectory, at a non-zero angle of incidence with respect to the perpendicular.

13. The method of claim 10, wherein the first ions form a ribbon beam having a long axis parallel to the second direction and a short axis parallel to the first direction.

14. The method of claim 10, comprising:
after the first exposure, performing an etch to transfer the plurality of holes into the second layer, wherein the etch takes place in a vertical direction along the perpendicular to the plane of the substrate.

15. The method of claim 10, wherein the plurality of holes comprises a set of contact holes in a memory array.

16. The method of claim 10, wherein the plurality of holes comprises an array of trenches,
wherein, before the first exposure, the array of trenches are characterized by a first spacing,
wherein, after the first exposure, the array of trenches are etched along the first direction and are characterized by a second spacing along the first direction, less than the first spacing.

17. The method of claim 16, wherein the array of trenches are not etched along a second direction, perpendicular to the first direction.

18. The method of claim 16, wherein the array of trenches comprises a first position before the first exposure, and a second position after the first exposure, shifted along the first direction with respect to the first position.

19. The method of claim 16, wherein the trajectory comprises a first trajectory, wherein the first exposure further comprises directing second ions to the surface feature along a second trajectory, opposite the first trajectory, at a non-zero angle of incidence with respect to the perpendicular, wherein a position of the array of trenches is not shifted by the first exposure.

* * * * *